United States Patent [19]

Travin

[11] 4,151,427
[45] Apr. 24, 1979

[54] HIGH-VOLTAGE ZERO-CROSSING DETECTOR

[76] Inventor: Lev V. Travin, Krasnokazormennaya ulitsa, 12, korpus 3, kv. 44, Moscow, U.S.S.R.

[21] Appl. No.: 816,031

[22] Filed: Jul. 15, 1977

[51] Int. Cl.² .................... H03K 17/72; H03K 5/153
[52] U.S. Cl. .................. 307/252 UA; 307/252 N; 307/354; 307/275
[58] Field of Search ....... 307/252 N, 252 Q, 252 UA, 307/275, 354; 323/18; 361/88, 93; 363/37, 68

[56] References Cited

U.S. PATENT DOCUMENTS

3,927,349  12/1975  Suhren et al. ............... 307/252 UA

*Primary Examiner*—John Zazworsky
*Attorney, Agent, or Firm*—Fleit & Jacobson

[57] ABSTRACT

A high-voltage zero-crossing detector comprising a voltage divider having a rectifier at its output, a stabilitron limiter and a transistorized blocking generator whose transistor base is connected via a capacitor to one of input terminals of the rectifier. Connected in parallel to an output of said rectifier are an energy storage capacitor and a series circuit made up of two capacitors shunted by the stabilitrons of the stabilitron limiter, their common point being connected to the emitter of the blocking generator's transistor which has its collector connected via the winding of a transformer of the blocking generator and a dinistor to the output of the rectifier.

2 Claims, 15 Drawing Figures

HIGH-VOLTAGE ZERO-CROSSING DETECTOR

The present invention relates to high-voltage and super-high-voltage engineering and, more particularly, to high-voltage zero-crossing detectors. The invention is applicable in cases when it is necessary to have information on high voltage zero crossing and transmit this information from the high potential to the ground potential. The invention is intended, in particular, to control high-voltage thyristor valves for high-voltage d.c. power line converters to realize the control method described, for example, in U.S. Pat. No. 3,715,606.

Known zero-crossing detectors employ different combinations of bistable multivibrators, amplifiers, invertors, flip-flops, adders, and other electronic devices (cf. U.S. Pat. No. 3,348,068, Cl. 307-88.5, IPC HO3k, of 1967, for "Threshold Discriminator and Zero-Crossing Detector"; U.S. Pat. No. 3,394,271, Cl. 307-235, IPC HO3k, of 1968, for "Pulse Producing Circuit for Indicating the Negative-Going Zero Crossing Points of an Applied a.c. Voltage"; U.S. Pat. No. 3,466,551, Cl. 328-146, IPC HO2k 5/20, of 1969; U.S. Pat. No. 3,560,768, Cl. 307-235, IPC HO3k 5/20, of 1970; and U.S. Pat. No. 3,768,024, Cl. 328-150, IPC HO3k 5/20, of 1973).

The foregoing devices have a number of serious disadvantages which hamper their uses in high-voltage systems. First of all, these devices are complicated and incorporate a relatively great number of transistors and other elements, which affects their reliability. Such devices require individual power sources and consume much power. In such devices no provisions are made to ensure their immunity from powerful electromagnetic and electrostatic fields. Besides, in order to transmit information from the high potential to the ground potential, such devices require additional signal forming and converting means.

In known high-voltage zero-crossing detectors employed in systems for controlling high-voltage thyristor valves for d.c. power line converters, use is made of active voltage dividers and threshold elements, for example, stabilitron limiters (cf. the above-mentioned U.S. Pat. No. 3,715,606; Swedish Pat. No. 338,099; Federal Germany Application No. 2,003,659; Federal Germany Application No. 2,000,422 of 1969; accepted Japanese Application No. 51,771/72). In all these devices, however, there are no elements for transmitting information on high voltage zero crossing from the high to the ground potential.

The device described in French Application No. 2,154,770, Cl. G 01 19/00, IPC HO3k 17/00, of 1973 (the analogue of this device being the one disclosed in U.S. Pat. No. 3,693,027) comprises a stepped ohmic divider, a capacitor connected via a rectifier in the form of a diode in parallel with the low-voltage arm of the divider, a switching stage built around a transistor, said switching stage being connected in parallel with the capacitor, and a thyristor which is snapped into operation as the switching stage is actuated, said thyristor being connected in series with a light-emitting diode which transmits information on alternating voltage zero crossing from the high potential to the ground potential. The device under review has the following disadvantages:

(a) it has a separate active element (the thyristor) to bring the light-emitting diode into operation;

(b) the operating speed of the device is not high enough, which is due, in the first place, to the time required to charge the capacitor through the high-resistance arm of the divider to reach the voltage at which the thyristor is actuated and the light-emitting diode is driven into conduction; in the second place, the inadequate operating speed of the device is due to the fact that a certain time is required to bring the thyristor itself into and out of conduction. As a result, the device under review cannot be used for detecting instants of zero crossing in the case of sharply raising or high-frequency alternating voltages;

(c) the device has a certain non-adjustable operation threshold, which, in combination with the charging of the capacitor from only one (positive) alternating voltage wave and the absence of energy accumulating elements, hampers the application of this device in systems for controlling high-voltage converter valves, when, for example, their adjustment angle is equal or close to zero.

In addition, all the above-mentioned devices are devoid of elements intended to prevent operation of the high-voltage zero-crossing detector in case there is flow of current through the high-voltage thyristor valve (if the detector is used to control the latter). This hinders effective application of such devices in systems for controlling high-voltage thyristor valves having internal inductance.

It is an object of the present invention to provide a high-voltage zero-crossing detector which would simplify the system of detecting high-voltage zero crossing and transmitting that information from the high potential to the ground potential, in particular, the system of controlling high-voltage thyristor valves, by combining the functions of detecting the instant of high-voltage zero crossing, and forming and converting a zero-crossing signal in one device. The invention further aims at providing an economical, interference-proof and fast-acting zero-crossing detector.

It addition, the invention aims to rule out misoperation of a zero-crossing detector used in a system for controlling a high-voltage thyristor valve having internal inductance.

The foregoing and other objects of the present invention are attained by providing a high-voltage zero-crossing detector comprising a stepped ohmic divider having a rectifier at its output, and a stabilitron limiter, which detector is provided, according to the invention, with a transistorized blocking generator whose transistor base is connected via a capacitor to one of the rectifier's input terminals, there being connected in parallel to its output an energy storage capacitor and a series circuit including two capacitors shunted by the stabilitrons of the stabilitron divider, their common point being connected to the emitter of the blocking generator's transistor which is connected via a dinistor to the rectifier's output.

It is expedient that in a detector intended for a system of controlling a high-voltage thyristor valve, the transformer of the blocking generator have an additional secondary winding whose leads are connected to the collector and emitter of a second transistor, there being applied to the base of said transistor, via a resistor, a signal from a means for indicating the presence of current through the high-voltage thyristor valve.

The proposed zero-crossing detector has a number of advantages which are especially manifest if the detector is employed in systems for controlling high-voltage thyristor units. These advantages are as follows:

1. Apart from detecting the instant of zero crossing by high voltage, the proposed detector performs the functions of forming and converting a zero-crossing pulse signal to be transmitted through a light communication channel from the high potential to the ground potential. This helps simplify the system of controlling a high-voltage thyristor valve.

2. The proposed detector is designed for using a light communication channel between the high potential and the ground potential, which makes it unnecessary to employ insulating transformers to transmit the above-mentioned pulse signal to the ground potential.

3. The fact that the output stage of the detector is a blocking generator, which generates a short (in the order of a few microseconds) pulse signal, makes less stringent the requirements imposed upon the light-emitting element of the light communication channel and simplifies the latter's circuitry. For example, the simplest light-emitting element of the light communication channel is a light-emitting diode.

4. The proposed detector does not require any individual power source, as it is fed directly by the voltage whose zero-crossing it detects. This simplifies the circuitry of the detector and of the whole system and raises their reliability.

5. Another factor that simplifies the circuitry and raises the reliability of the detector is the fact that the rectifier bridge also serves as an element of the power supply circuit of the detector and a sensitive element.

6. The proposed detector is highly economical, for its circuitry is devoid of elements which discharge the energy storage capacitors at periods of time when no zero-crossing signal is applied.

7. The proposed detector is interference-proof and fast-acting.

8. If the proposed detector is employed in a system for controlling a high-voltage thyristor valve having an internal inductance coil, there is no misoperation of the detector when the latter is acted upon by voltage drops across the inductance coil or due to any other reason during flow of current through the high-voltage thyristor valve.

9. The proposed detector can also be used, without any modifications, in high and superhigh a.c. and d.c. voltage systems whenever it is necessary to detect zero crossing between two points in the high potential region.

10. The proposed detector makes it possible to detect zero-crossings of high-frequency oscillating voltage (of a frequency of several tens of kilocycles per second).

Other objects and advantages of the present invention will become more apparent from the following detailed description of preferred embodiments thereof taken in conjunction with the accompanying drawings, wherein.

Figure 1:
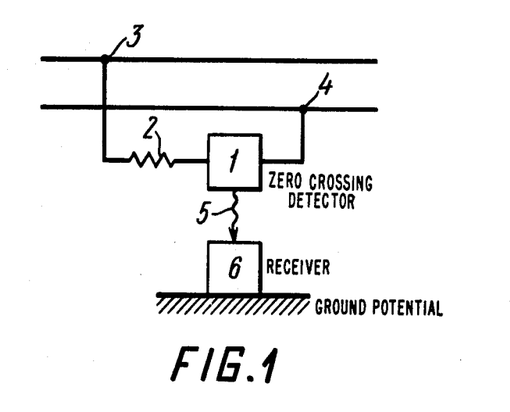
FIG. 1 is a connection diagram of a high-voltage zero-crossing detector in a high-voltage a.c. or d.c. system.

FIG. 1 shows a connection diagram of a zero-crossing detector in a high-voltage a.c. or d.c. system. The zero-crossing detector 1 is set on the high potential and connected via a resistor 2 to points 3 and 4 of a high-voltage system, wherein it is necessary to detect positive- or negative-going zero-crossing points. An output of the zero-crossing detector 1 is connected via a communication channel 5 (for example, a light communication channel) to an input of a receiving means 6 connected to the ground potential.

Figure 2:
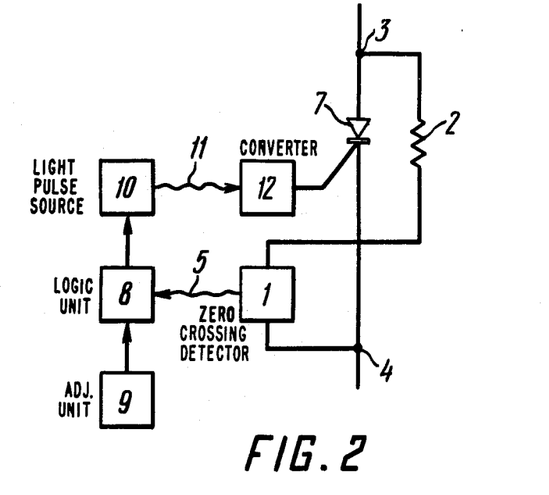
FIG. 2 is a connection diagram of a high-voltage zero-crossing detector when employed in a system for controlling a high-voltage thyristor valve intended for d.c. power line converters.

FIG. 2 is a connection diagram of a zero-crossing detector when used in a system for controlling a high-voltage thyristor valve intended for d.c. power line converters. In this case the zero-crossing detector 1 is electrically interposed via the resistor 2 between an anode 3 and a cathode 4 (as in FIG. 2) of a high-voltage thyristor valve 7. The output of the detector 1 is connected via the communication channel 5 (for example, a light communication channel) to a first input of a logical circuit unit 8 whose second input is connected to an output of an automatic adjustment system 9 of a converter (not shown).

An output of the logical circuit unit 8 is connected to a control light pulse source 10 whose output is connected via a communication channel 11 to an input of a converter 12 of control light pulses into control electric pulses outputs of said converter 12 being connected to control electrodes of the thyristors of the high-voltage thyristor valve 7 (the drawing showing only one such thyristor).

Figure 3:
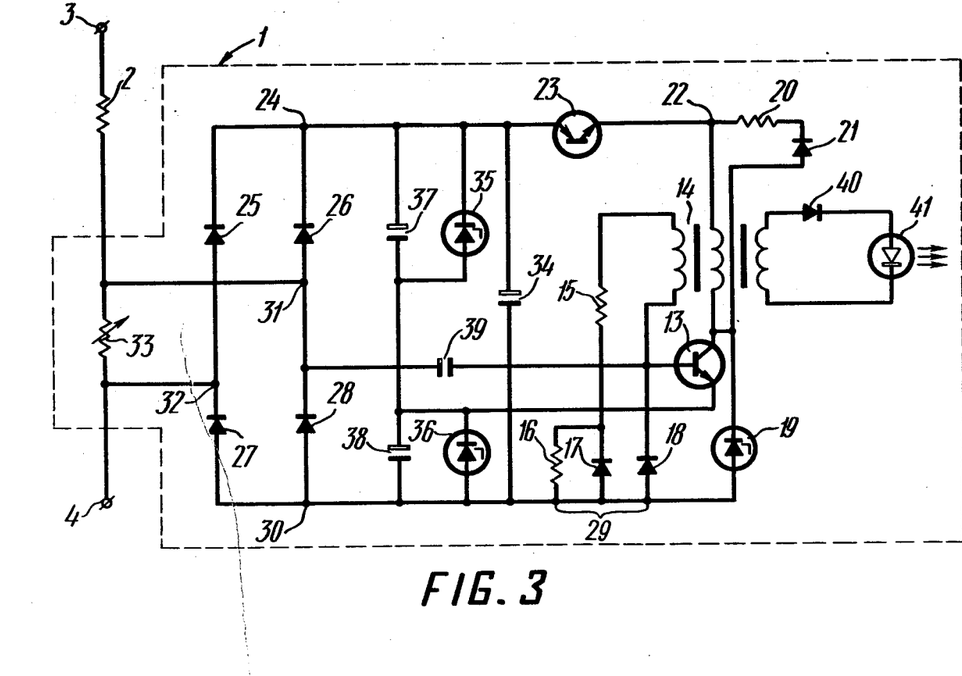
FIG. 3 shows the circuitry of a high-voltage zero-crossing detector in accordance with the invention.

FIG. 3 shows the circuitry of the proposed zero-crossing detector. The basic element of the detector 1 is a blocking generator built in any known manner around a transistor 13 and a transformer 14 the latter usually having collector and base windings connected correspondingly to the collector and base terminals of transistor 13, as well as the output or load winding, and incorporating resistors 15 and 16, diodes 17 and 18, a stabilitron 19, a resistor 20, and a diode 21. The beginning of a collector winding 22 of the transformer 14 is connected via a dinistor 23 to a positive pole 24 of a rectifier comprising diodes 25, 26, 27 and 28. A point 29 of connection of the elements 16, 17, 18 and 19 of the blocking generator is connected to a negative pole 30 of the rectifier. An input of the rectifier (points 31 and 32) is connected in parallel with a variable resistor 33, one of whose leads is connected to the point 4, whereas its other lead is connected via the resistor 2 to the point 3, the voltage to be checked being applied between the points 3 and 4. Connected in parallel with the output of the rectifier are an energy storage capacitor 34 and a stabilitron voltage limiter made up of series placed stabilitrons 35 and 36. Connected in parallel with said stabilitrons 37 and 38, their connection point being connected to the emitter of the transistor 13. The base of the blocking generator's transistor 13 is connected via a capacitor 39 to the input point 31 of the rectifier. An output winding of the blocking generator's transformer 14 is connected via a diode 40 to an input of a light-emitting device 41 (for example, a light-emitting diode).

Figure 4:
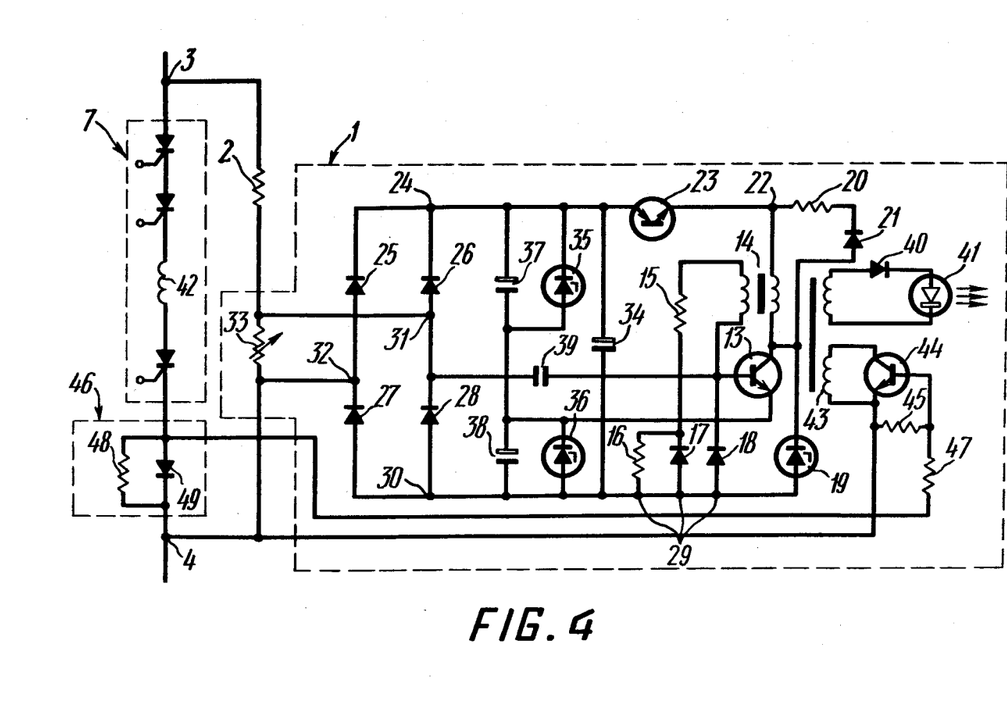
FIG. 4 shows the circuitry of a high-voltage zero-crossing detector employed in a system for controlling a high-voltage thyristor valve (an alternative embodiment of the invention)

FIG. 4 is a key diagram of the zero-crossing detector 1 used in a system for controlling the high-voltage thyristor valve 7 having an internal inductance coil 42. In this case the transformer 14 of the blocking generator has an additional winding 43 whose leads are connected to the collector and emitter of a second transistor 44. Between the base and emitter of the transistor 44 there is interposed a stabilizing resistor 45. The emitter of the transistor 44 is connected to one lead of a nonlinear shunt 46. The base of the transistor 44 is connected via a resistor 47 to the other lead of the nonlinear shunt 46 which is connected in series with the high-voltage thyristor valve 7. The nonlinear shunt 46 may be made up of resistor 48 and diode 49 connected in parallel; it may also comprise a current transformer (not shown) whose secondary winding leads are connected to the anode and cathode of a diode 49, its primary winding being connected in series with the high-voltage thyristor valve 7.

As is shown in FIG. 1, the high-voltage zero-crossing detector 1 is set on the high potential and serves to detect instants of positive- and negative-going zero crossing between the points 3 and 4 of a high-voltage a.c. or d.c. system, as well as to transmit at such moments short pulse signals through the communication channel 5 (for example, a light communication channel) from the high potential to the receiving means 6 on the ground potential.

If the zero-crossing detector 1 is employed in a system for controlling a high-voltage thyristor valve 7, as is shown in FIG. 2, the detector 1 is set on the potential of the cathode 4 of the valve 7 and generates pulse signals indicating zero crossing by the voltage between the anode 3 and the cathode 4 of the valve 7, which signals are transmitted through the communication channel 5 to the first input of the logical circuit unit 8 of the system for controlling the valve 7. Applied to the second input of the logical circuit unit 8 is a signal from the automatic adjustment system 9 of the converter, which signal determines the beginning and duration of a preselected conduction interval of the valve 7. Pulse signals are applied from the zero-crossing detector 1 to the output of the logical circuit unit 8 only in cases when zero-crossing between the anode 3 and the cathode 4 of the valve 7 occurs during the conduction interval set by the automatic adjustment system 9 of the converter.

Output signals of the logical circuit unit 8 are applied to the input of the control light pulse source 10, transmitted through the communication channel 11 to the control light pulse converter 12, wherein they are converted into electric pulses, and are then distributed over the control electrodes of the thyristors of the high-voltage thyristor valve 7. Thus, during each commercial frequency cycle e.g., 50 or 60 Hz, at the beginning of the conduction interval of the valve 7, there is applied to the control electrodes of the thyristors of the high-voltage thyristor valve 7 a short control pulse; such a pulse is also applied to said control electrodes at each subsequent moment of positive-going zero crossing by voltage across the valve 7 during the preset conduction interval (if such zero crossings actually do occur); said pulses are recorded by the zero-crossing detector 1.

As is seen from FIG. 3, the basic element of the proposed zero-crossing detector 1 is the blocking generator built around the transistor 13 and the transformer 14 having collector, base and output (load) windings, and including the elements 15, 16, 17, 18, 19, 20, and 21. The blocking generator is fed from the lower arm of the divider made up of the resistors 2 and 33 and electrically interposed between the points 3 and 4 via the rectifier built around the diodes 25, 26, 27 and 28, connected to whose output are energy storage capacitors 34, 37 and 38. Direct voltage across said capacitors, i.e. the supply voltage of the blocking generator, is limited by the stabilitrons 35 and 36. Voltage across the capacitor 38, determined by the stabilitron 36, is employed to snap the transistor 13 out of conduction in the absence of trigger signals, which improves the interference immunity of the detector 1.

At the moments when there appears positive voltage between the points 3 and 4 (for example, between the anode and cathode of the high-voltage thyristor valve), the positive voltage at the point 31 increases with respect to that at the point 30. This signal is applied via the capacitor 39 to the base of the transistor 13 and actuates the blocking generator.

The capacitor 39 and the input resistor of the blocking generator make up a differentiating circuit, which means that the triggering current pulse passes through the base-emitter junction of the transistor 13 only during the time of an increase in the positive voltage at the point 31 with respect to the potential at the point 30. Thus, the rectifier built around the diodes 25, 26, 27 and 28, which ensures the feeding of the blocking generator, also acts as a sensitive element. The operation threshold of the detector 1 may be smoothly adjusted by changing the resistance value of the variable resistor 33.

During the period of initial charging of capacitors 34, 37 and 38, the dinistor 23 prevents operation of the blocking generator until the voltage across the capacitor 34 is increased to a voltage sufficient for normal operation of the blocking generator. The circuit comprising the resistor 20 and the diode 21 damps free oscillation in the transformer 14 after the blocking generator has been actuated. The diode 18 protects the base-emitter junction of the transistor 13 from reverse-sign overvoltages. The stabilitron 19 protects the transistor 13 from voltage surges across the collector winding of the transformer 14.

The load of the output winding of the transformer 14 of the blocking generator is the light-emitting device 41 (for example, a light-emitting diode). The diode 40 protects the light-emitting device 41 from the effects of negative voltage surges.

As may be seen from FIG. 3, the voltage between points 30 and 31 may have two extreme values. First, a positive value equal to E across capacitor 34, which occurs when the instantaneous positive voltage between points 3 and 4, divided by the voltage divider of resistors 2 and 33, exceeds the voltage E and diodes 26 and 27 are conducting. Second, a negative value, equal to the voltage drop across diode 28, which occurs when the instantaneous negative voltage between points 3 and 4, divided by the voltage divider of resistors 2 and 33, exceeds the voltage E and diodes 25 and 28 are conducting. As may be seen from FIG. 3, actuating signals can reach the input of the blocking generator only when the diodes 26 and 28 of the rectifier bridge are out of conduction, since any positive going signals between points 30 and 31 will be fed away when diode 26 is conducting and, similarly, any negative going signals will be fed away by diode 28, a pulse of current flowing through the capacitor 39 to the base of transistor 13 will take place and actuate the blocking generator only when voltage between the points 30 and 31 raises from zero to a value sufficient for operation of the detector. During the periods of time when the diode 28 is conducting (there being negative voltage between the points 3 and 4), the input of the blocking generator is shunted by the conducting diode 28; when the diode 26 is conducting (the voltage between the points 31 and 32 being positive and in excess of that across the capacitor 34), there are connected to the input of the blocking generator (between the points 31 and 30) high-value energy storage capacitors, the voltage across said capacitors changing very slowly. This accounts for high interference immunity of the detector 1, which is extremely important if the detector operates at a high potential and in the presence of powerful electromagnetic and electrostatic fields.

The value of a current signal that actuates the blocking generator changes with an increase in the rate at which the positive voltage is raised between the points 31 and 30. This raises the operating speed of the detector 1 at moments when a high operating speed is absolutely necessary, i.e. during fast zero crossings between the points 3 and 4.

The presence of the high-value energy storage capacitors 34, 37 and 38 accounts for the possibility of repeated operation of the detector 1 during one commercial frequency cycle, e.g., 50–60 Hertz, which means that the detector 1 is capable of detecting high-voltage zero crossings (at a frequency of several tens of kilocycles per second).

Figure 5:
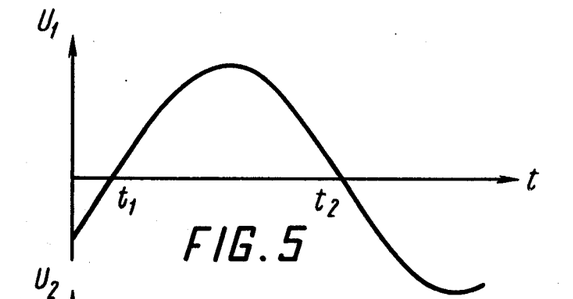
FIGS. 5 and 6 show waveforms of sine voltages $U_1$ and $U_2$ between points of connection of the detector.
Figures 6, 7:
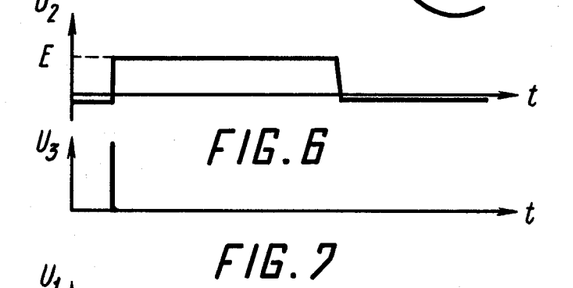
FIG. 7 shows the pulse shape of voltage $U_3$ at the output of the detector.

FIG. 5 shows waveforms of sine voltage $U_1$ between the points 3 and 4 of FIGS. 1 through 3. FIG. 6 shows the waveform of voltage $U_2$ between the points 31 and 30 of FIG. 3. FIG. 7 shows the waveform of pulse voltage $U_3$ at the output of the detector, which pulses are applied to the light-emitting device 41 of FIG. 3.

As is seen from FIGS. 5, 6, and 7, the detector 1 operates at the moment $t_1$ of positive-going zero crossing of voltage $U_1$ (in this case the voltage of the operation threshold V of the detector 1 is assumed to be equal to zero), when voltage $U_2$ sharply changes from a small negative value (the voltage drop across the conducting diode 28) to a positive operation voltage E. In order to make the detector 1 operate at the moment $t_2$, i.e. during the negative-going zero crossing of voltage $U_2$, it is sufficient to reverse the conductors connected to the points 31 and 32 of FIG. 3.

Figure 8:
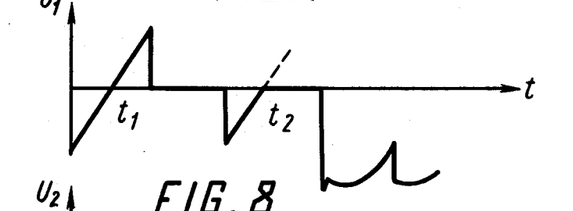
FIGS. 8, 9 and 10 are schematic representations of waveforms of voltages $U_1$, $U_2$ and $U_3$ in the case when the high-voltage zero-crossing detector of the present invention is employed in a system for controlling a high-voltage thyristor valve.
Figure 9:
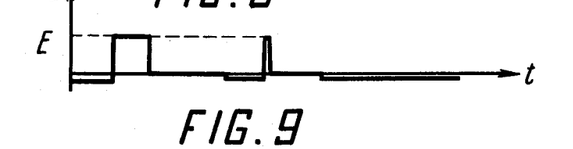
Figure 10:
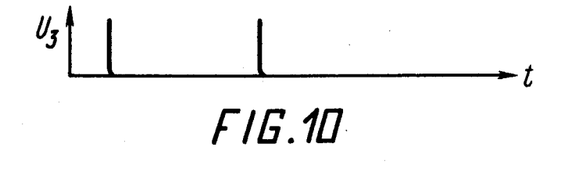
Figure 11:
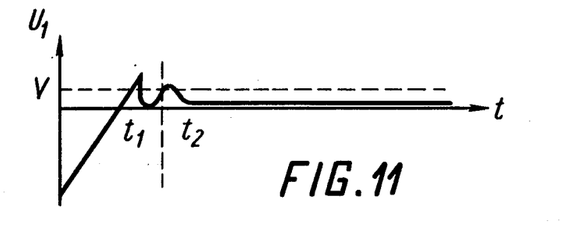
FIG. 11 shows the waveform of voltage $U_1$ between points of connection of the detector of FIG. 4.
Figure 12:
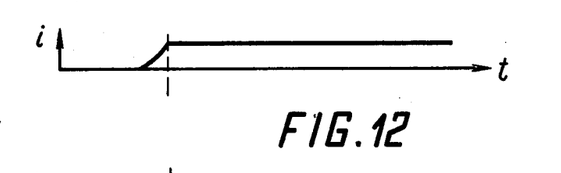
FIG. 12 shows the waveform of current i flowing through a high-voltage thyristor valve.
Figure 13:
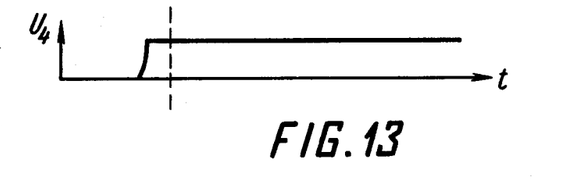
FIG. 13 shows the waveform of voltage $U_2$ between points of connection of the detector of FIG. 4.
Figure 14:
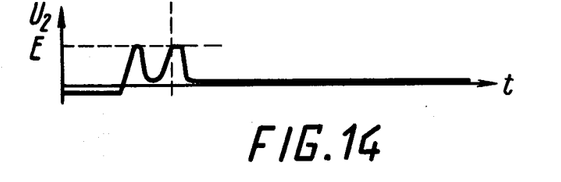
FIG. 14 shows the waveform of voltage $U_3$ at the output of the detector.
Figure 15:
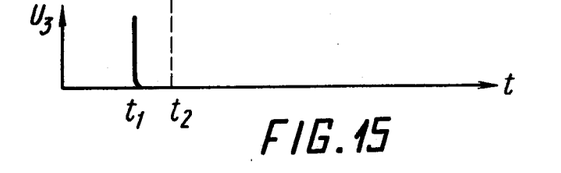
FIG. 15 shows the waveform of voltage $U_4$ at the output of a nonlinear shunt.

FIGS. 8, 9, and 10 show in a simplified form waveforms of voltages $U_1$, $U_2$, and $U_3$ in the case when the detector 1 is employed in a system for controlling the high-voltage thyristor valve 7 (FIG. 2) constructed as a three-phase bridge converter operating with intermittent direct current. As is seen from FIG. 6, the second detector 1 operates two times (at the moments $t_1$ and $t_2$) during one commercial frequency cycle and during positive-going zero crossings of voltage $U_1$ across the valve 7, whereby the valve 7 is repeatedly brought into conduction at the moment $t_2$ during the preselected conduction interval of the valve 7.

In a number of cases, when the detector 1 is used in a system for controlling the high-voltage thyristor valve 7 having the internal inductance element 42 (for example, saturable reactors, inductive current dividers, etc.), as is shown in FIG. 4, alterations in the current flowing through the valve 7 (for example, in the course of a commutation) result in a voltage drop across the inductance element 42, $L \cdot (di/dt)$, which may actuate the detector 1. The latter is unnecessary, though, because there is already current passing through the valve 7, which means that the valve 7 is already conducting.

To eliminate this effect, the operation threshold V of the detector 1 has to be raised by reducing the resistance value of the resistor 33, which is undesirable as it increases the full operating time of the detector 1 with respect to the time of zero crossing by voltage across the valve 7. In order to lower the operation threshold of the detector 1 and rule out misoperation of the detector 1 in cases of changes in the current flowing through the valve 7, the detector 1 is provided with a suppression means as shown in FIG. 4. The suppression means comprises the transistor 44, which shunts the additional secondary winding 43 of the transformer 14, and the resistors 45 and 47. A signal to the suppression means is applied from the nonlinear shunt 46 made up, for example, of the resistor 48 and the diode 49 interconnected in parallel.

FIGS. 11 through 15 show waveforms of voltage $U_1$ between the anode 3 and the cathode 4 of the valve 7 (FIG. 4), current i flowing through the valve 7 and the nonlinear shunt 46, voltage $U_2$ between the points 31 and 30, voltage $U_3$ at the output of the detector 1, and voltage $U_4$ at the output of the nonlinear shunt 46 with the valve 7 having a converter adjustment angle of about 0°.

After the valve 7 becomes conducting at the moment $t_1$, there flows current i through the valve 7 and the nonlinear shunt 46, which causes a surge of positive voltage $U_1$ at the moment $t_2$, which voltage reaches the operation threshold V of the detector 1. From the nonlinear shunt 46 the signal $U_4$ is applied to the base of the transistor 44. The latter is driven into conduction, the resistance between the collector and emitter of the transistor 44 becomes less than the critical resistance of the blocking generator's load at the transistor 13, so the blocking generator can no longer be actuated even in the presence of the actuating signals $U_2$ applied to its input via the capacitor 39 at the moment $t_2$.

What is claimed is:

1. A high-voltage zero-crossing detector comprising: a voltage divider; a rectifier connected to an output of said voltage divider; a stabilitron limiter having two stabilitrons connected in series, a blocking generator having a transistor and a transformer; the base of said transistor being connected to an input of said rectifier; there being connected in parallel across the outputs of said rectifier an energy storage capacitor and a series circuit made up of two capacitors; each of said capacitors being shunted by one of said stabilitrons of said stabilitron limiter; the common point of said stabilitrons being connected to the emitter of said transistor of said blocking generator; the collector of said transistor being connected to said transformer which is connected via a dinistor to an output of said rectifier.

2. A high-voltage zero-crossing detector as claimed in claim 1, to be employed in a system for controlling a high-voltage thyristor valve, wherein said transformer of said blocking generator has a secondary winding whose leads are connected to the collector and emitter of a second transistor, to whose base there is applied, via a resistor, a signal from a means for indicating the flow of current through said high-voltage thyristor valve.

* * * * *